(12) United States Patent
Frohberg et al.

(10) Patent No.: US 7,838,354 B2
(45) Date of Patent: Nov. 23, 2010

(54) METHOD FOR PATTERNING CONTACT ETCH STOP LAYERS BY USING A PLANARIZATION PROCESS

(75) Inventors: Kai Frohberg, Niederau (DE); Sven Mueller, Wiednitz (DE); Christoph Schwan, Gebhardshain (DE)

(73) Assignee: Advanced Micro Devices, Inc., Austin, TX (US)

( * ) Notice: Subject to any disclaimer, the term of this patent is extended or adjusted under 35 U.S.C. 154(b) by 522 days.

(21) Appl. No.: 11/692,267

(22) Filed: Mar. 28, 2007

(65) Prior Publication Data
US 2008/0057720 A1 Mar. 6, 2008

(30) Foreign Application Priority Data
Aug. 31, 2006 (DE) ........................ 10 2006 041 006

(51) Int. Cl.
*H01L 21/8238* (2006.01)
(52) U.S. Cl. .................. 438/199; 438/938; 438/958; 438/970
(58) Field of Classification Search ................. 438/199, 438/938, 958, 970
See application file for complete search history.

(56) References Cited

U.S. PATENT DOCUMENTS

| | | | | |
|---|---|---|---|---|
| 5,100,503 A | * | 3/1992 | Allman et al. | 438/694 |
| 5,229,326 A | * | 7/1993 | Dennison et al. | 438/586 |
| 6,825,529 B2 | | 11/2004 | Chidambarrao et al. | 257/336 |
| 6,939,814 B2 | | 9/2005 | Chan et al. | 438/778 |
| 7,105,394 B2 | * | 9/2006 | Hachimine et al. | 438/197 |
| 7,323,391 B2 | * | 1/2008 | Arghavani | 438/285 |
| 7,442,637 B2 | * | 10/2008 | Su et al. | 438/624 |
| 7,482,215 B2 | * | 1/2009 | Dyer et al. | 438/199 |
| 2003/0186529 A1 | * | 10/2003 | Goto et al. | 438/622 |
| 2006/0113641 A1 | * | 6/2006 | Hohage et al. | 257/640 |
| 2006/0160314 A1 | | 7/2006 | Arghavani | 438/285 |

FOREIGN PATENT DOCUMENTS

DE 102004057762 A1 * 6/2006
WO WO2006/093730 9/2006

OTHER PUBLICATIONS

Translation of Official Communication from German Patent Office for German Patent Application No. 10 2006 041 006.8-33 dated Mar. 15, 2010.

* cited by examiner

*Primary Examiner*—Amir Zarabian
*Assistant Examiner*—Christy L Novacek
(74) *Attorney, Agent, or Firm*—Williams, Morgan & Amerson, P.C.

(57) ABSTRACT

By performing a planarization process, for instance based on a planarization layer, prior to forming a resist mask for selectively removing a portion of a stressed contact etch stop layer, the strain-inducing mechanism of a subsequently deposited further contact etch stop layer may be significantly improved.

20 Claims, 7 Drawing Sheets

METHOD FOR PATTERNING CONTACT ETCH STOP LAYERS BY USING A PLANARIZATION PROCESS

BACKGROUND OF THE INVENTION

1. Field of the Invention

Generally, the present disclosure relates to the field of integrated circuits, and, more particularly, to the manufacturing of field effect transistors having a strained channel region.

2. Description of the Related Art

Integrated circuits typically comprise a large number of circuit elements on a given chip area according to a specified circuit layout, wherein, in complex circuits, the field effect transistor represents one predominant circuit element. Generally, a plurality of process technologies are currently practiced, wherein, for complex circuitry based on field effect transistors, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The shrinkage of the transistor dimensions, however, involves a plurality of issues associated therewith that have to be addressed so as to not unduly offset the advantages obtained by steadily decreasing the channel length of MOS transistors. One problem in this respect is the development of enhanced photolithography and etch strategies so as to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

Since the continuous size reduction of the critical dimensions, i.e., the gate length of the transistors, necessitates the adaptation and possibly the new development of process techniques concerning the above-identified complex process steps, it has been proposed to enhance device performance of the transistor elements not only by reducing the transistor dimensions but also by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, while the reduced channel length may even require enhanced dopant concentrations in order to control short channel effects, thereby making a reduction of the dopant concentration a less attractive approach unless other mechanisms are developed so as to adjust a desired threshold voltage. Second, the lattice structure in the channel region may be modified, for instance by creating tensile or compressive strain therein, which results in a modified mobility for electrons and holes, respectively. For example, creating tensile strain in the channel region of a silicon layer having a standard crystallographic configuration may increase the mobility of electrons, which, in turn, may directly translate into a corresponding increase in the conductivity for N-type transistors. On the other hand, compressive strain in the channel region may increase the mobility of holes, thereby providing the potential for enhancing the performance of P-type transistors. Consequently, it has been proposed to introduce, for instance, a silicon/germanium layer or a silicon/carbon layer in or below the channel region so as to create tensile or compressive stress. Although the transistor performance may be considerably enhanced by the introduction of strain-creating layers in or below the channel region, significant efforts have to be made to implement the formation of corresponding strain-inducing layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Therefore, a technique is frequently used that enables the creation of desired stress conditions within the channel region of different transistor elements by adjusting the stress characteristics of a contact etch stop layer that is formed above the basic transistor structure in order to form contact openings to the gate and drain and source terminals in an interlayer dielectric material. The effective control of mechanical stress in the channel region, i.e., effective stress engineering, may be accomplished by individually adjusting the internal stress in the contact etch stop layer of the respective transistor in order to position a contact etch contact layer having an internal compressive stress above a P-channel transistor while positioning a contact etch stop layer having an internal tensile strain above an N-channel transistor, thereby creating compressive and tensile strain, respectively, in the respective channel regions.

Typically, the contact etch stop layer is formed by plasma enhanced chemical vapor deposition (PECVD) processes with a moderately high degree of conformality above the transistor, i.e., above the gate structure and the drain and source regions, wherein, for instance, silicon nitride may be used, due to its high etch selectivity with respect to silicon dioxide, which is a well-established interlayer dielectric material. Furthermore, PECVD silicon nitride may be deposited with a high intrinsic stress, for example, up to 2 Giga Pascal (GPa) or significantly higher of tensile or compressive stress, wherein the type and the magnitude of the intrinsic stress may be efficiently adjusted by selecting appropriate deposition parameters. For example, ion bombardment, deposition pressure, substrate temperature, gas components and the like represent respective parameters that may be used for obtaining the desired intrinsic stress.

In a typical process sequence, a contact etch stop layer having compressive stress is formed above the transistors after completing the formation of respective metal silicide regions. In order to protect the silicide regions during the further patterning process, an etch stop layer may be provided prior to depositing the compressive etch stop layer. Thereafter, the etch stop layer may be removed from the N-channel transistor by providing a resist mask and etching the exposed portion of the etch stop layer, using the etch stop layer as an etch stop. Next, a thin etch stop layer or etch indicator layer may be formed, followed by the deposition of a tensile etch stop layer, which is subsequently removed from the P-channel transistor on the basis of a corresponding resist mask and the etch indicator layer. In this manufacturing regime, however, a lower performance gain as expected may be observed in circuit areas including densely placed NMOS devices.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein is directed to a technique for forming a stressed overlayer above semiconductor devices having a pronounced surface topography, such as field effect transistors and the like, wherein the stressed overlayer is to be selectively removed on the basis of an appropriately dimensioned etch mask formed on the basis of a corresponding photolithography process. In order to reduce the creation of layer residuals upon selectively removing the stressed overlayer, the photolithography process may be performed on a surface having a reduced surface topography. Consequently, the corresponding lithography process and the subsequent selective etch process may be performed with increased uniformity, thereby reducing the effect of residual portions of the stressed overlayer during the further processing, when forming a further stressed layer over exposed device regions. Consequently, the efficiency of a respective process flow for individually providing respective stressed overlayers above specific device regions including respective transistor elements may be significantly enhanced.

According to one illustrative embodiment disclosed herein, a method comprises forming a first stress-inducing layer above a patterned first device region and a second device region and forming a first planarization layer above the first and second device regions so as to planarize a surface topography of the first and second device regions. Furthermore, a first resist mask is formed above the first planarization layer to cover the first device region. Moreover, the method comprises removing an exposed portion of the first planarization layer and the first stress-inducing layer from the second device region, wherein said first stress-inducing layer has an intrinsic stress of approximately 1.5 GPa or higher.

According to another illustrative embodiment disclosed herein, a method comprises forming a planarization layer above first and second transistors having formed there above a first stress-inducing layer having a first type of intrinsic stress. Furthermore, a resist mask is formed on the planarization layer, wherein the resist mask covers the first transistors. The first stress-inducing layer is removed from the second transistor and a second stress-inducing layer is formed above the first and second transistors, wherein the second stress-inducing layer has a second type of intrinsic stress that differs from the first type of intrinsic stress.

According to yet another illustrative embodiment disclosed herein, a method comprises forming a first stress-inducing stress layer having a first type of intrinsic stress above a first device region and a second device region, wherein the first and second device regions comprise first and second transistors, respectively. Furthermore, a first interlayer dielectric material is formed above the first and second device regions, wherein the first interlayer dielectric material has a first type of intrinsic stress and reduces height differences of a surface topography of the first and second device regions. Furthermore, the first stress-inducing layer and the first interlayer dielectric material are selectively removed from the second device region and a second stress-inducing layer having a second type of intrinsic stress is selectively formed above the second device region. Additionally, a second interlayer dielectric material is formed above the first and second device regions, wherein the second interlayer dielectric material has a second type of intrinsic stress.

BRIEF DESCRIPTION OF THE DRAWINGS

The disclosure may be understood by reference to the following description taken in conjunction with the accompanying drawings, in which like reference numerals identify like elements, and in which.

Figure 1A:
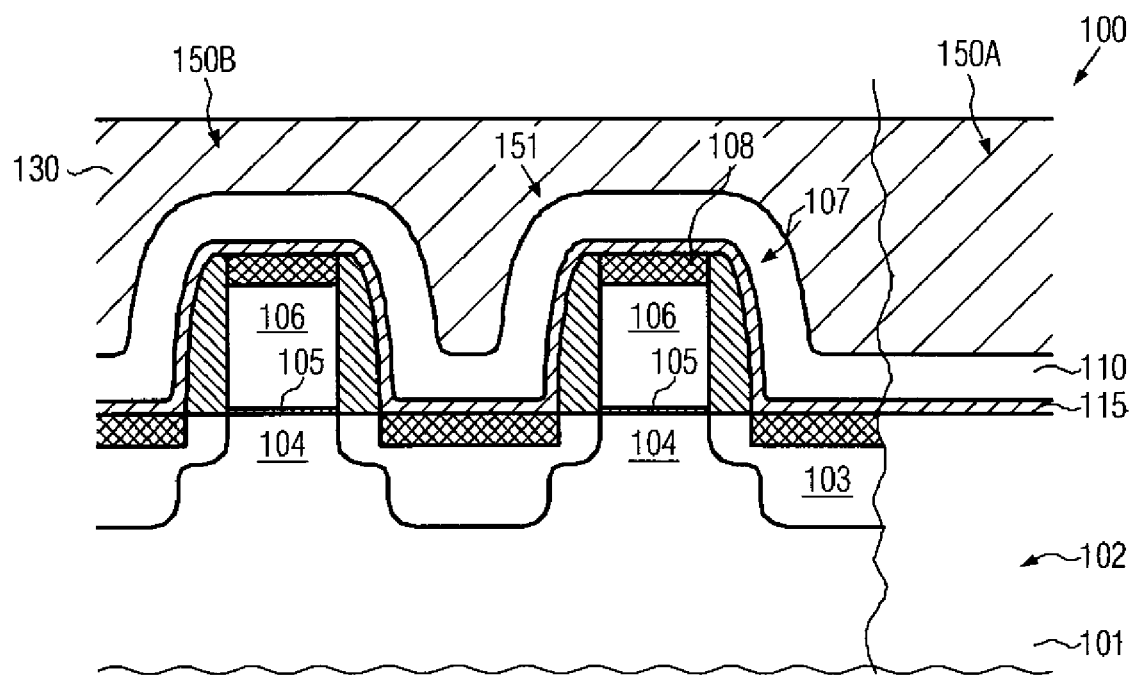
FIGS. 1a-1c schematically illustrate cross-sectional views of a semiconductor device during various manufacturing stages for patterning a stress overlayer on the basis of a planarized surface topography prior to forming a second stress overlayer according to illustrative embodiments disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to a technique for forming differently stressed overlayers, such as contact etch stop layers, above respective device regions, which may, for instance, comprise transistors of different conductivity types, in order to individually adjust the respective strain created in the channel regions of these transistors. In highly scaled semiconductor devices, respective device regions may comprise densely packed conductive lines, such as polysilicon lines, gate electrodes of adjacent transistor devices and the like, which may result in a significant surface topography, wherein, as previously explained, a less pronounced performance gain may be observed, in particular in device regions including densely packed gate electrodes of transistor devices. For instance, in a respective manufacturing sequence as previously described, a less than expected performance gain of densely packed NMOS transistors may be observed. Without intending to restrict the present invention to the following explanation, it is believed that a significant influence of material residuals of the respective stressed contact etch stop layer after selectively removing the same may be responsible for significantly degrading the corresponding stress-inducing mechanism of a subsequently deposited stress contact etch stop layer having a different type of stress, which may therefore interact with the previously formed layer residuals. It is assumed that the non-uniform removal of the first contact etch stop layer may be caused by resist thickness variations, which may result in corresponding resist residuals upon forming a corresponding resist mask to expose the respective contact etch stop layer portion to be removed. Thus, during the subsequent etch process, respective resist residuals may result in the unwanted layer residuals. Therefore, the present invention contemplates a reduction of height differences of the pronounced surface topography prior to actually forming a resist layer so as to enhance the performance of the subsequent photolithography process. Consequently, the resulting resist mask may be provided with enhanced uniformity, i.e., respective exposed resist portions may be efficiently removed, thereby enhancing the uniformity of the further processing for selectively removing unwanted portions of the underlying contact etch stop layer.

FIG. 1a schematically illustrates a semiconductor device 100 comprising a substrate 101, which may represent any appropriate substrate for forming thereon and therein respective circuit elements, such as transistors, capacitors and the like. For example, the substrate 101 may represent any appropriate carrier material having formed thereon an appropriate semiconductor layer 102, such as a silicon-based layer and the like, wherein the semiconductor layer 102 may be located on a crystalline base material, when the substrate 101 represents a bulk semiconductor substrate, or the semiconductor layer 102 may be formed on a buried insulating layer (not shown) so as to provide a silicon-on-insulator (SOI) configuration. In illustrative embodiments, the semiconductor layer 102 may represent a silicon material, since the vast majority of complex integrated circuits may be formed on the basis of silicon, the characteristics of which, with respect to charge carrier mobility, may be efficiently adjusted on the basis of strain-inducing mechanisms as previously described. Furthermore, a first device region 150A and a second device region 150B may be defined above the substrate 101, for instance, by respective isolation structures (not shown), such as shallow trench isolations and the like, or may be defined by functional differences, such as logic areas of a complex circuitry versus memory areas and the like. Consequently, respective circuit elements may be provided in the first and second device regions 150A, 150B which may require a different type of strain induced in respective portions of the semiconductor layer 102. For convenience, respective circuit elements, such as field effect transistors 151, are shown in the second device region 150B only. At this manufacturing stage, the respective transistors 151 may comprise respective drain and source regions 103 defining respective channel regions 104, above which respective gate electrodes 106 may be formed, which are separated from the respective channel regions 104 by corresponding gate insulation layers 105. For example, the transistors 151 may represent N-channel transistors, which may obtain a corresponding strain-inducing mechanism so as to create a respective tensile strain in the channel regions 104. In other illustrative embodiments, the transistors 151 may represent P-channel transistors, depending on the device and process requirements. Similarly, in the first device region 150A, there may be provided respective circuit elements (not shown) requiring a different type of strain-inducing mechanism. The transistors 151 may represent closely packed devices, wherein a distance between adjacent gate electrodes 106 may be in the range of several hundred nanometers or even less, while a gate length, i.e., the horizontal extension of the gate electrodes 106 in FIG. 1a, may be approximately 90 nm and significantly less, such as 50 nm and less.

Furthermore, the transistors 151 may comprise respective spacer structures 107, which may have any appropriate configuration, depending on device and process requirements.

Furthermore, metal silicide regions 108 may be formed, if required, to increase the conductivity of the drain and source regions 103 and the gate electrodes 106. Furthermore, a first stressed overlayer 110 is formed above the first and second device regions 150A, 150B, wherein, in some illustrative embodiments, as shown in FIG. 1a, a corresponding etch stop layer 115 having a high etch selectivity with respect to the material of the layer 110 may be provided. For example, the etch stop layer 115 may be comprised of silicon dioxide, while the first stressed overlayer 110 may be comprised of silicon nitride, which may exhibit a desired high intrinsic stress of approximately 1.5 GPa or higher, for instance a high compressive stress, when the first overlayer 110 is designed as a strain-inducing source for the first device region 150A. In other illustrative embodiments, the etch stop layer 115 may not be provided, when a corresponding etch damage caused in the transistors 151 upon a selective removal of the layer 110 may be acceptable. Furthermore, in this manufacturing stage, the semiconductor device 100 may comprise a planarization layer 130 which may be formed of any appropriate material, such as a polymer material, a resist material or other dielectric materials, as will be described in more detail later on with reference to FIGS. 2a-2d. The planarization layer 130 may be comprised of a material that may be reliably removed selectively to the layer 110 as will be described later on.

A typical process flow for forming the semiconductor device 100 as shown in FIG. 1a may comprise the following processes. The transistors 151 and any other circuit elements may be formed on the basis of well-established manufacturing techniques. That is, the gate electrodes 106 and the gate insulation layers 105 may be formed on the basis of advanced deposition/oxidation, photolithography and etch techniques, while the complex dopant profiles in the channel regions 104 and the drain and source regions 103 may be obtained by appropriate implantation processes, diffusion processes, epitaxial growth techniques and the like, depending on the process and device requirements, wherein the respective spacer structures 107 may be appropriately provided in the respective manufacturing stage to act as an efficient implantation mask, if required. Thereafter, the metal silicide regions 108 may be formed, wherein, prior to or after the formation of the metal silicide regions 108, appropriate anneal processes may be performed to activate dopants, re-crystallize crystal damage and thermally stabilize the metal silicide regions 108. Thereafter, the etch stop layer 115, if provided, may be formed on the basis of well-established chemical vapor deposition (CVD) techniques, wherein, for instance, silicon dioxide may be deposited with a desired thickness of several nanometers or more, depending on the device requirements. Thereafter, the first stress layer 110 may be deposited, for instance on the basis of a plasma enhanced chemical vapor deposition (PECVD) process, in which respective process parameters, such as ion bombardment, deposition pressure, temperature, gas flow and the like, may be appropriately selected to obtain a desired stress of the material being deposited on the layer 115 or directly on the respective metal silicide regions 108 and the sidewall spacer structures 107. Depending on the respective process parameters, in particular depending on the degree of ion bombardment during the deposition process, a high tensile stress or a high compressive stress up to approximately 2 GPa or even higher may be produced with respect to the underlying material. Furthermore, a thickness of the layer 110 may be selected so as to obtain the desired stress level, while, in some illustrative embodiments, the thickness of the layer 110 may be selected in view of its etch stop characteristics during a later anisotropic etch process for forming respective contact openings in an interlayer dielectric material still to be formed. Next, the planarization layer 130 may be formed, which, in some illustrative embodiments, may be accomplished on the basis of an appropriate polymer material that may be applied by well established spin-on techniques to provide a highly non-conformal deposition behavior, thereby significantly reducing any height differences in the surface topography of the first and second device regions 150A, 150B.

Thereafter, the respective material of layer the 130 (in its highly deformable state) may be appropriately treated, for instance cured by elevated temperatures and/or radiation and the like, so as to provide a highly non-deformable state for the further processing of the device 100. In other illustrative embodiments, the planarization layer 130 may be provided by other deposition techniques, such as CVD having a substantially flow-like deposition behavior in order to significantly reduce any height differences so as to enhance the efficiency of a subsequent lithography process.

Figure 1B:
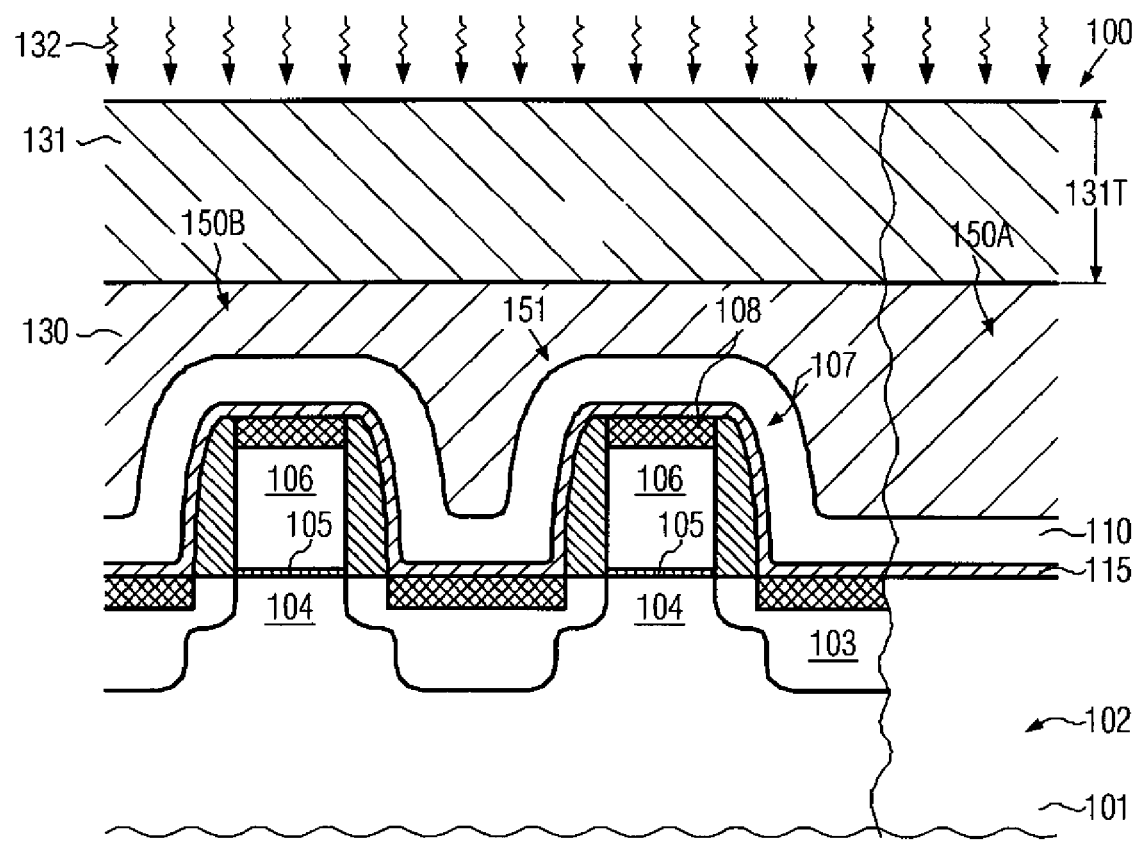

FIG. 1b schematically illustrates the semiconductor device 100 at a further advanced manufacturing stage. Here, a resist layer 131 is formed on the planarization layer 130, wherein the significantly reduced surface topography provided by the planarization layer 130 results in a substantially uniform layer thickness 131T of the resist layer 131. Consequently, during an exposure 132, a significantly enhanced exposure uniformity may be achieved so that the exposed portion of the resist layer 131 may be removed with increased efficiency compared to conventional techniques, in which the resist layer 131 is typically provided without the planarization layer 130, thereby resulting in significant thickness variations, which may conventionally negatively affect the exposure process 132, as is previously described. In some illustrative embodiments, the planarization layer 130 may be selected so as to act as an efficient anti-reflective coating (ARC), thereby even further enhancing the efficiency of the exposure process 132. Thereafter, the resist layer 131 may be developed to provide a respective resist mask and the exposed portion of the planarization layer 130 may be removed.

Figure 1C:
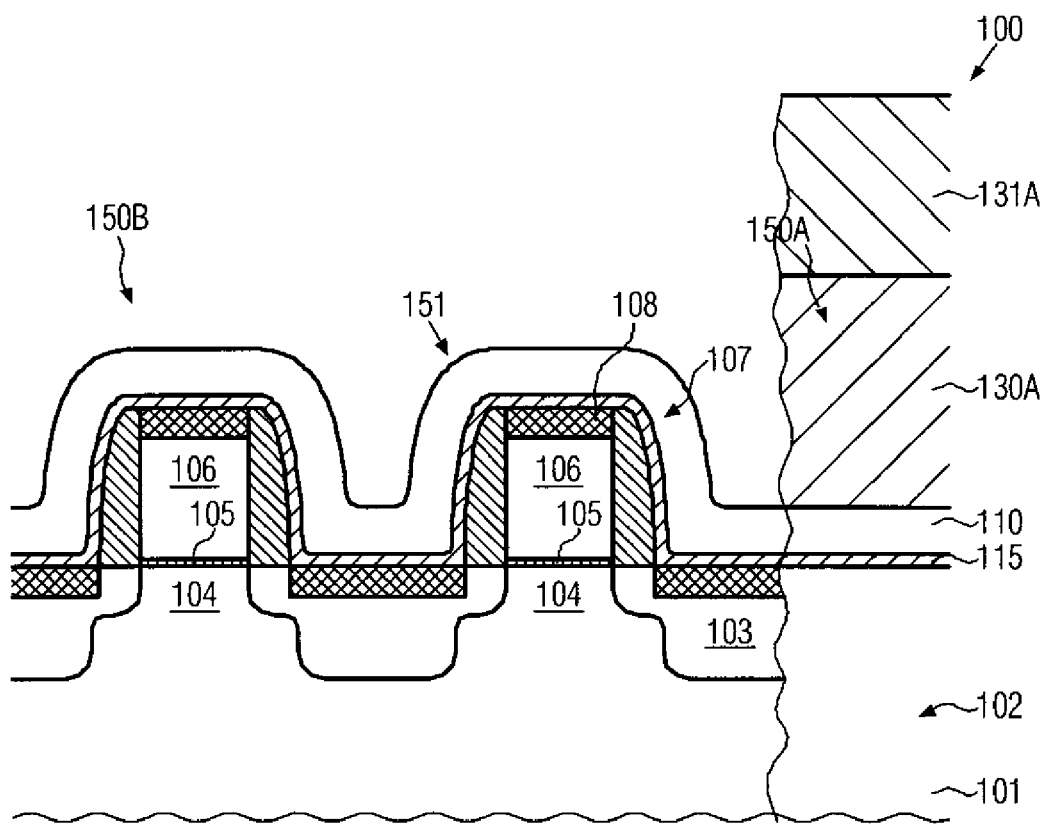

FIG. 1c schematically illustrates the semiconductor device 100 after the above-described process sequence. That is, the device 100 comprises a resist mask 131A and the respective patterned planarization layer, now indicated as 130A, which reliably cover the first device region 150A while exposing the second device region 150B, substantially without any resist or polymer residuals, which may unduly affect the subsequent etch process for selectively removing the exposed portion of the first stress layer 110. Consequently, the layer 110 may be efficiently removed in the second device region 150B on the basis of well-established selective etch recipes using the resist mask 131A and/or the patterned planarization layer 130A as an etch mask. Thereafter, further processing may be continued as will be described with reference to FIGS. 1e-1f later on.

Figure 1D:
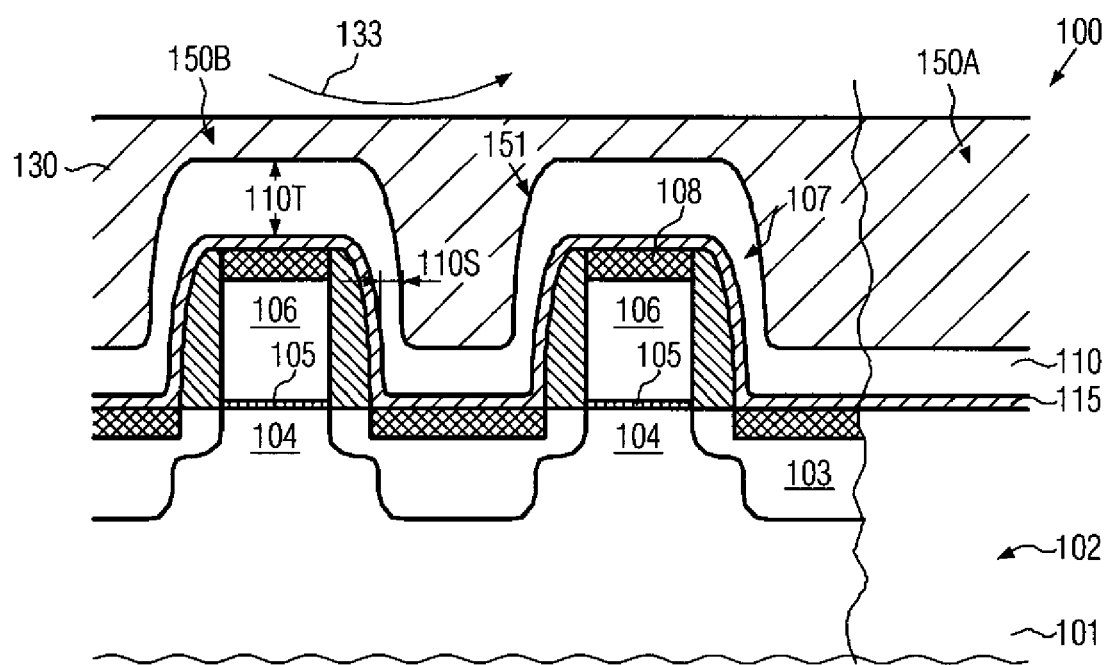
FIG. 1d schematically illustrates a planarization layer obtained by performing an additional planarization process according to yet other illustrative embodiments.

FIG. 1d schematically illustrates the semiconductor device 100 according to further illustrative embodiments. In one illustrative embodiment, the planarization layer 130 may be formed of any appropriate material and any appropriate deposition technique, wherein a remaining surface topography may be even further reduced by performing an additional planarization process 133, which may comprise a chemical mechanical polishing (CMP) process, or any other planarization technique. For instance, if the planarization layer 130 is provided in a highly deformable state, the planarization process 133 may be performed by mechanically contacting the planarization layer 130 in its highly deformable state in order to reduce any height differences in the layer 130. For example, a deformation surface of a die (not shown) may be brought into contact with the layer 130, or a planarizing role may be moved across the device 100 in order to obtain a surface topography of enhanced planarity. Consequently, even a very pronounced surface topography of the underlying device region 150B may be efficiently planarized.

Furthermore FIG. 1d illustrates a further illustrative embodiment, in which, with or without the planarization process 133, the first stressed overlayer 110 may be formed as a highly non-conformal layer in order to enhance the stress transfer mechanism for circuit elements in the first device region 150A (not shown), thereby providing an increased amount of "horizontally" deposited material of the layer 110 to more efficiently transfer the respective stress to underlying horizontal device portions. For example, the corresponding non-conformal deposition may, however, also result in a corresponding non-conformal deposition behavior in the second device region 150B, thereby even further enhancing the pronounced surface topography. For example, a non-conformal deposition of the layer 110, which may have a positive effect in the first device region 150A, may be understood as a ratio of a thickness 110S taken at a substantially vertical device surface and a thickness 110T taken at a substantially horizontal device surface, wherein the corresponding ratio may be 0.7 or significantly less. Thus, by providing the planarization layer 130, possibly in combination with the further planarization process 133, an even more pronounced surface topography, for instance caused by a highly non-conformal deposition of the layer 110, may be efficiently reduced in order to provide high uniformity of the corresponding exposure process 132 as described above.

Figure 1E:
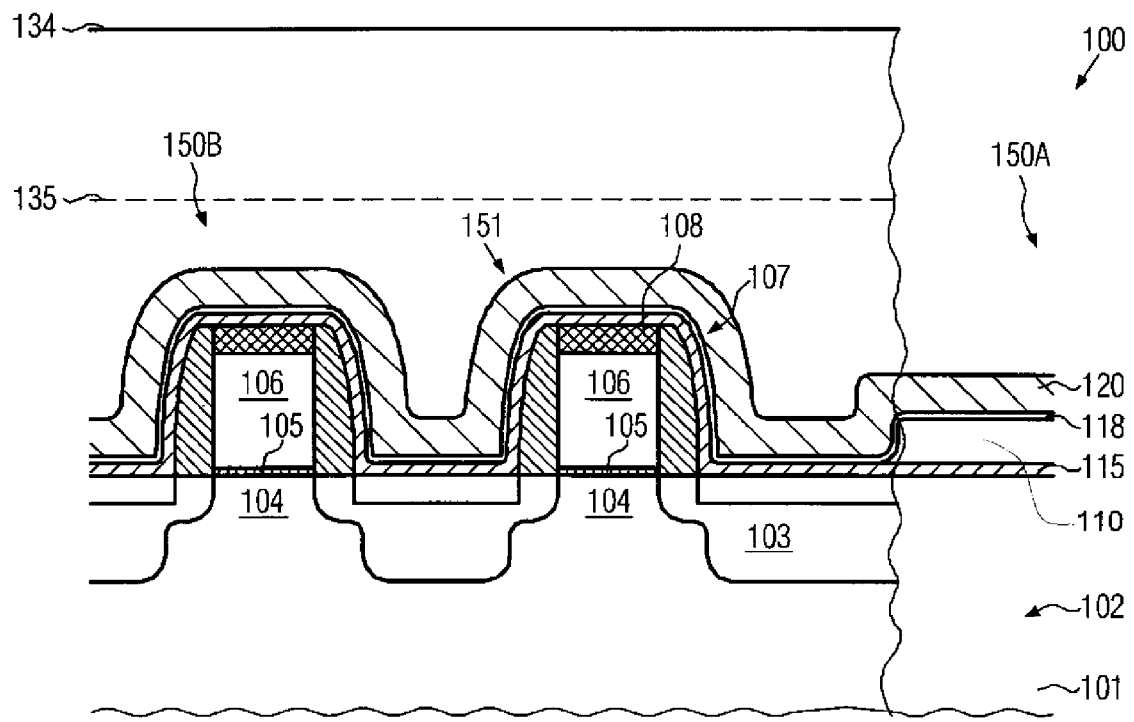
FIGS. 1e-1f schematically illustrate cross-sectional views of the semiconductor device in further advanced manufacturing stages for forming respective stressed overlayers of different intrinsic stress and using the stressed overlayers as contact etch stop layers according to illustrative embodiments disclosed herein.

FIG. 1e schematically illustrates the semiconductor device 100 at a further advanced manufacturing stage. Here, the device has formed thereon a second stressed overlayer 120, which may comprise a high intrinsic stress selected for improving the performance of the respective circuit elements in the second device region 150B, i.e., the transistors 151. Furthermore, the device 100 may comprise an etch indicator layer 118, which may be comprised of silicon dioxide and the like, and which may be used for controlling a respective etch process for selectively removing the second stress layer 120 from the first device portion 150A on the basis of a further etch mask 134.

The etch indicator layer 118 may be formed on the basis of well-established deposition techniques, such as PECVD and the like, while the second stress layer 120 may be formed on the basis of a PECVD process, while selecting respective process parameters so as to obtain the desired high degree of intrinsic stress. For instance, the layer 120 may exhibit a high tensile stress, when the corresponding transistor elements 151, which may represent N-channel transistors, require a high tensile strain in the respective channel regions 104. Furthermore, in some illustrative embodiments, the mask 134, which may represent a resist mask, may be formed on the basis of an additional optional planarization layer 135, indicated as dashed lines, when a reliable removal of corresponding layer portions of the second stress layer 120 in the first device region 150A may be considered as critical. It should be appreciated, however, that the removal of the second layer 120 in the first device region 150A may, in some cases, be less critical, since respective layer residuals may not substantially affect the overall stress transfer mechanism provided by the first layer 110. Based on the mask 134, the layer 120 may then be selectively removed from the first device region 150A on the basis of well-established selective etch recipes, wherein the etch indicator layer 118 may be used for obtaining a reliable signal for controlling the respective etch process. In other illustrative embodiments, the etch indicator layer 118 may be provided with a sufficient thickness so as to act as an etch stop layer for the selective removal of the layer 120, when the corresponding combined thickness of the layers 115 and 118 in the second device region 150B may unduly affect the stress transfer mechanism.

Figure 1F:
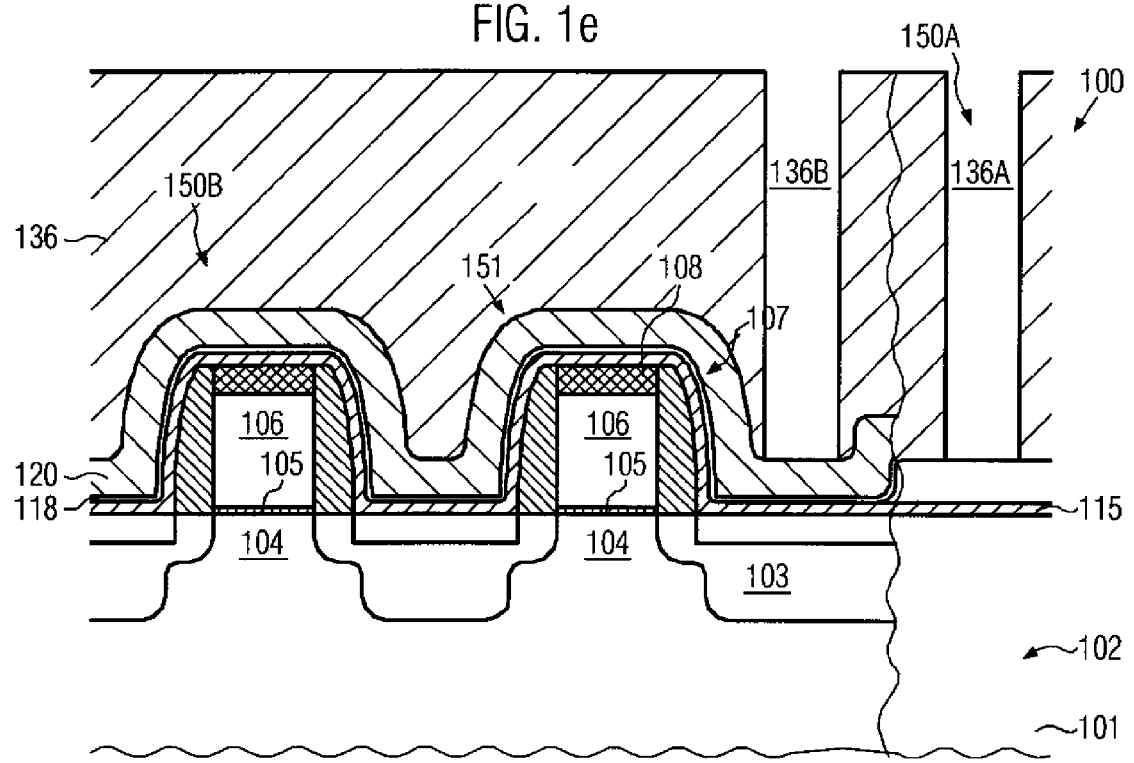

FIG. 1f schematically illustrates the semiconductor device in a further advanced manufacturing stage, wherein an interlayer dielectric material 136 is formed above the first and second device regions 150A, 150B, having formed therein respective contact openings 136A, 136B. The interlayer dielectric material 136 may be formed on the basis of well-established recipes, for instance on the basis of a PECVD process using TEOS as a precursor material for forming a silicon dioxide material having a high degree of mechanical stability. Thereafter, a corresponding etch mask may be formed (not shown) and may be used in an anisotropic etch process in order to form the contact openings 136A, 136B, wherein the respective stress layers 120 and 110 may act as efficient etch stop layers. These layers may be subsequently opened in combination with any underlying layers, such as the etch indicator layer 118 and/or the etch stop layer 115, in a correspondingly designed etch process.

As a consequence, due to the additional planarization of the surface topography prior to actually patterning the first stress layer 110, a significantly enhanced patterning process may be accomplished, even above the device region 150B having a pronounced surface topography. Consequently, the corresponding strain induced by the second stress layer 120 into the respective transistor elements 151 may be significantly enhanced due to a substantial reduction of any unwanted layer residuals of the first layer 110 in the second device region 150B. Furthermore, in some illustrative embodiments, the corresponding surface topography may be even further enhanced by intentionally providing one or both of the layers 110 and 120 as a highly non-conformal stress layer, which may then, however, not unduly negatively affect the further processing. For example, in FIG. 1e, the second layer 120 may also be provided as a substantially non-conformal material layer, thereby also creating a pronounced surface topography in the first device region 150A, which may then also be efficiently reduced on the basis of the optional planarization layer 135, thereby also enhancing the corresponding patterning process. Furthermore, if required, the additional planarization process 133 may provide a further reduction of a residual non-uniformity.

With respect to FIGS. 2a-2d, further illustrative embodiments will now be described, in which a planarization of a surface topography may be accomplished on the basis of providing a first portion of an interlayer dielectric material, which may be maintained for specified device portions so as to also act as an etch stop layer during a subsequent selective removal of a second stressed overlayer.

Figure 2A:
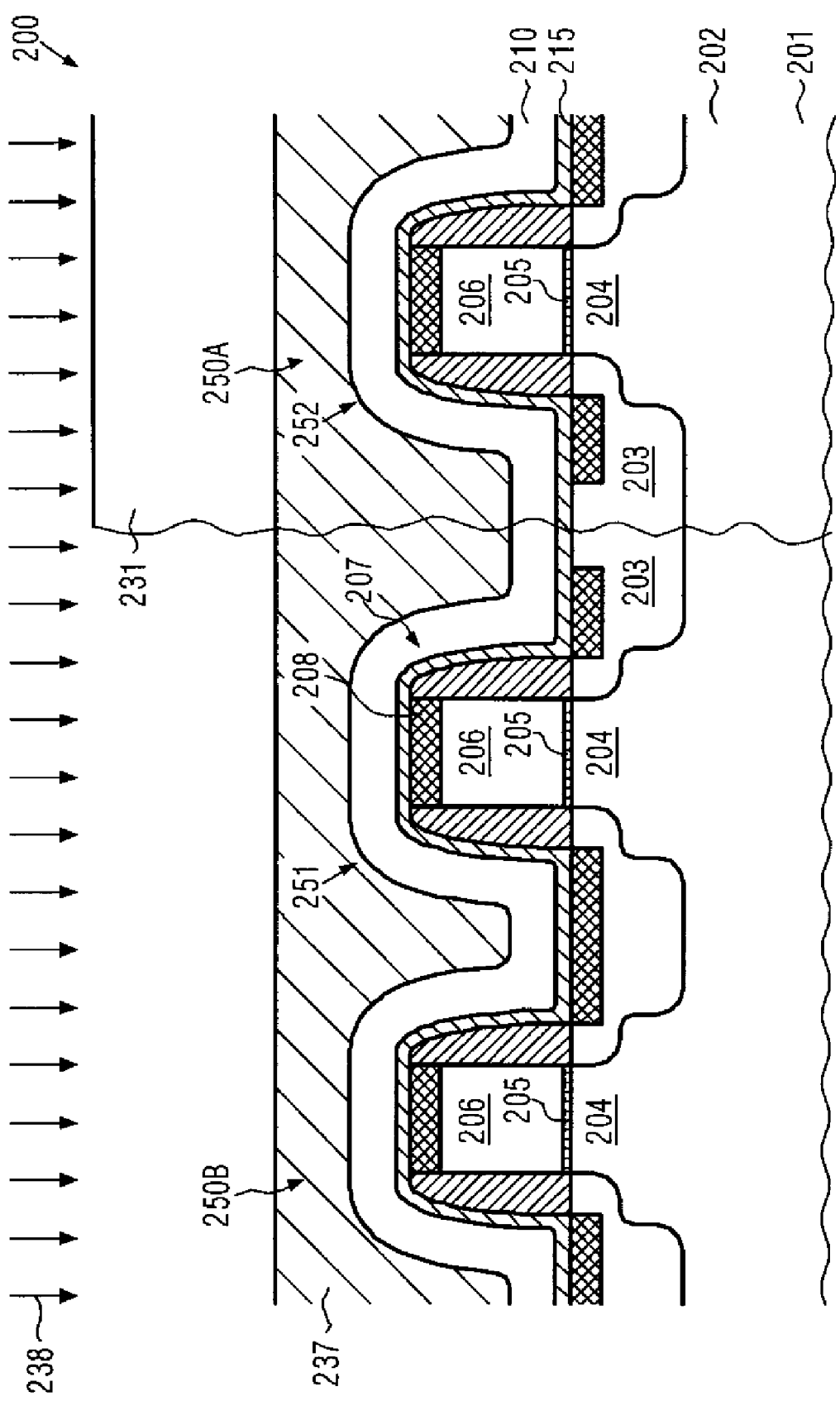
FIGS. 2a-2b schematically illustrate cross-sectional views of a semiconductor device receiving differently stressed contact etch stop layers using an interlayer dielectric material for providing an improved surface topography according to further illustrative embodiments.

FIG. 2a schematically illustrates a semiconductor device 200 comprising a first device region 250A and a second device region 250B formed above a substrate 201, which comprises a semiconductor layer 202. With respect to the substrate 201 and the semiconductor layer 202, the same criteria apply as previously explained with reference to the device 100. Furthermore, the first device region 250A may comprise a first transistor 252, which may represent, for instance, a P-channel transistor, or any other transistor requiring a specified type of intrinsic stress provided by a first stress layer 210 formed above the first and the second device regions 250A, 250B. Furthermore, in the second device region 250B, respective transistors 251 are provided, for instance in the form of N-channel transistors and the like. It should be appreciated that any other configuration of the transistors 252, 251 may be contemplated by the present invention, wherein the transistors 251 may require a different type of strain or at least a different magnitude of strain compared to the transistor 252. The respective transistors 251, 252 may differ in their conductivity type, the transistor configuration and the like, wherein, for convenience, any such differences are not shown in the drawings. Thus, the respective components of the transistors are illustrated as substantially identical, wherein it should be appreciated that the respective components may nevertheless be different for the different transistors 251, 252. Thus, the transistors 251, 252 may each comprise respective drain and source regions 203, which are separated by respective channel regions 204. Furthermore, gate electrodes 206 formed on respective gate insulation layers 205 may be provided, while appropriate sidewall structures 207 may be formed on the respective sidewalls of the gate electrodes 206. Furthermore, metal silicide regions 208 may be provided in accordance with device requirements. With respect to the components 203 to 207, the same criteria apply as previously explained with reference to the device 100. Furthermore, at this manufacturing stage, an etch stop layer 215 may be formed on the transistors 251 and 252 followed by the stress layer 210 and a planarization layer 237, which may be provided in the form of an appropriate interlayer dielectric material, such as silicon dioxide and the like. Furthermore, a corresponding etch mask 231, such as a resist mask 231, may be provided in order to cover the first device region 250A while exposing the second device region 250B.

The semiconductor device 200 as shown in FIG. 2a may be formed on the basis of substantially the same processes as previously explained with reference to the device 100. Additionally, after forming the first stress layer 210, the interlayer dielectric material 237 may be formed on the basis of any appropriate deposition technique, such as PECVD, when a highly stable silicon dioxide is considered appropriate for the material 237. In other illustrative embodiments, the interlayer dielectric material 237 may be provided in the form of a less stable silicon dioxide formed on the basis of a sub-atmospheric thermal chemical vapor deposition process, which may typically result in a material having a tensile stress, while the corresponding PECVD process for silicon dioxide on the basis of TEOS may provide a highly compressive stress for the material 237. Depending on the deposition process, the material as deposited may be planarized, for instance by a CMP process, in order to provide a respective surface topography having reduced height differences for enhancing a corresponding lithography process for forming the mask 231, as is also previously explained. For example, when forming a silicon dioxide on the basis of a PECVD process, the resulting layer may have a pronounced surface topography due to the underlying topography and a corresponding CMP process may be performed in order to obtain the desired enhanced surface topography. Due to the high mechanical stability, the corresponding CMP process may not unduly affect the overall characteristics of the material 237 and the underlying components. In other illustrative embodiments, the sub-atmospheric chemical vapor deposition process may provide a substantially flow-like deposition behavior, which may result in a suitable surface topography without further planarization processes. In other cases, a silicon dioxide deposited by a sub-atmospheric chemical vapor deposition process may be treated by a subsequent planarization step, for instance on the basis of CMP. In this case, the finally obtained tensile stress may be significantly reduced or may even be converted into a compressive stress due to the incorporation of moisture into the dielectric material 237 during the CMP processing, wherein appropriate stress adjusting treatments may be performed in a later stage in order to obtain the desired type of stress in the material 237.

On the basis of the enhanced surface topography provided by the planarization layer 237, i.e., the interlayer dielectric material, the mask 231 may be formed and may be used as an etch mask for an etch process 238, which may comprise a first step for selectively etching the material 237, wherein the layer 210 may act as an etch stop layer, and for subsequently removing the material 210, wherein the layer 215 may be used as a reliable etch stop. For example, corresponding selective etch processes for silicon dioxide and silicon nitride are well established and may be used for this purpose. For example, an anisotropic etch step may be used for selectively removing the material 237 and a highly selective wet chemical etch process may be used for subsequently removing the exposed portion of the layer 210 selectively to the etch stop layer 215.

Figure 2B:
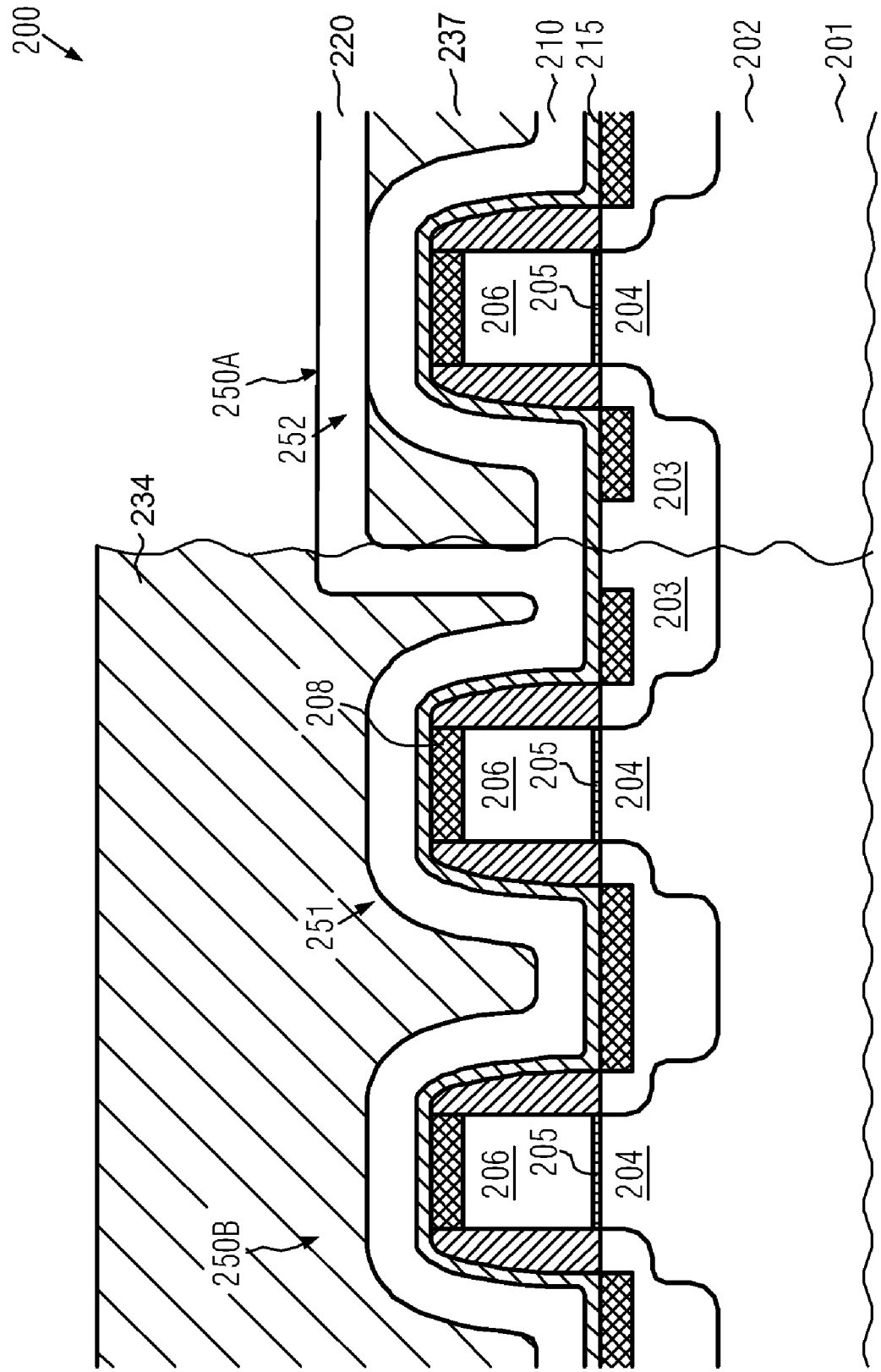

FIG. 2b schematically illustrates the semiconductor device 200 at a further advanced manufacturing stage. Here, a second stress layer 220 is formed above the second transistor 251 and also on the remaining portion of the interlayer dielectric material 237. Furthermore, a second etch mask 234, for instance in the form of a resist mask, may be provided to cover the second device region 250B while exposing the first device region 250A. With respect to any manufacturing processes for forming the second stress layer 220, reference can be made to the respective components 210 and 120 as previously described. For example, the second stress layer 220 may comprise a high intrinsic tensile stress, wherein, additionally, a highly efficient stress transfer mechanism may be provided, since, for instance, a further etch control layer, such as the etch indicator layer 118, may be omitted for the patterning of the layer 220. Furthermore, as previously described, also in this case, one or both of the layers 210 and 220 may be provided as highly non-conformal layers, as is previously explained with reference to FIG. 1b.

Next, the etch mask 234 may be formed on the basis of well-established lithography techniques. Thereafter, the exposed portion of the second stress layer 220 may be selectively removed from the first device region 250A on the basis of any appropriate selective etch recipe, wherein the remaining interlayer dielectric material 237 may act as a reliable etch stop layer. As previously explained, the material 237 may exhibit a high compressive stress, when, for instance, formed by PECVD techniques, thereby efficiently enhancing the overall stress-inducing mechanism in the transistor 252, when the layer 210 may also be provided with a high intrinsic compressive stress. In other illustrative embodiments, the corresponding material 237 may have been provided on the basis of a sub-atmospheric chemical vapor deposition technique, thereby providing the material 237, at least initially, with a significant tensile stress. As previously explained, during the subsequent processing, for instance a CMP process and the like, the tensile stress may be reduced or may even be converted into a compressive stress, which may, in this case, be advantageous in view of the overall strain-inducing effect. Thus, when the transistor 252 may be a transistor requiring a high tensile stress, wherein the layer 210 may be provided as a tensile stress layer, a respective tensile stress may also be provided in the material 237, while, in other cases, the tensile stress 237 may be effectively reduced or converted into a compressive stress, wherein, in some illustrative embodiments, an appropriate treatment may be performed on the exposed material 237 after the removal of the layer 220. For example, a respective species may be incorporated, such as water and the like, in order to provide the desired degree of stress relaxation or the creation of compressive stress, when a sub-atmospheric chemical vapor deposition silicon dioxide is considered. Thereafter, a further interlayer dielectric material may be deposited in accordance with device requirements so as to embed the first and second transistors 251, 252. Next, the further processing may be continued by forming respective contact openings, wherein the layers 220 and 210 may be used as efficient etch stop layers, as is previously explained.

Figure 2C:
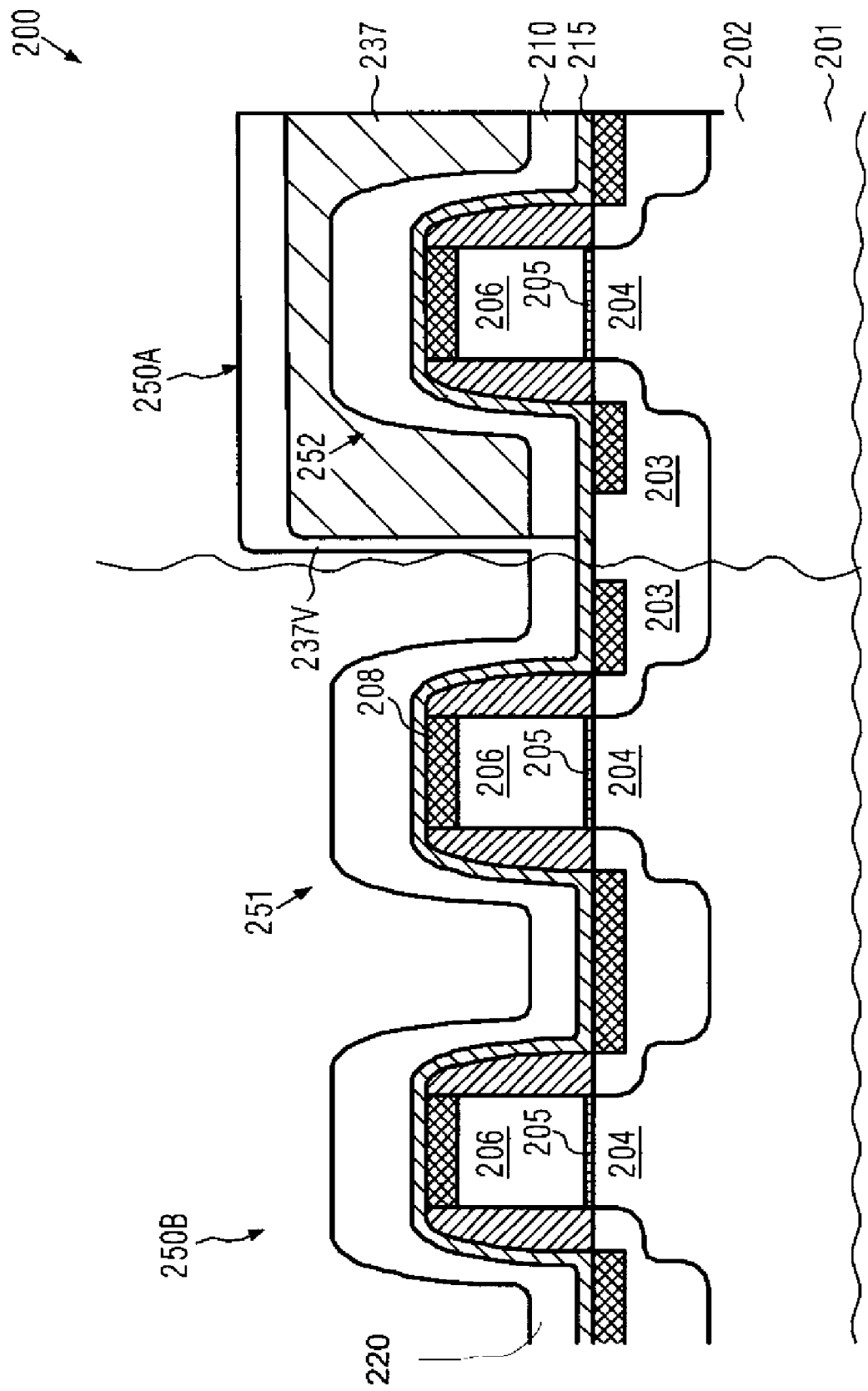
FIGS. 2c-2d schematically illustrate cross-sectional views of a semiconductor device having differently stressed contact etch stop layers in combination with additional stress-inducing sources according to yet other illustrative embodiments disclosed herein.

FIG. 2c schematically illustrates the semiconductor device 200 in accordance with yet another illustrative embodiment, wherein one or both of the layers 210 and 220 are provided in a highly non-conformal manner, thereby reducing a thickness of the corresponding layer 220 at a vertical portion 237V of the dielectric material 237, when a residue of the layer 220 having the thickness of the layer 220 as shown in FIG. 2b is considered inappropriate. Thus, as previously explained, a highly efficient strain-inducing mechanism may be provided, since the non-conformal layers 210, 220 may provide efficient stress transfer, while, additionally, any etch indicator layers may be omitted, wherein, in some illustrative embodiments, even the etch stop layer 215 may be omitted, when a respective etch damage in the region 250B may be acceptable. Furthermore, even if a reduced thickness at the vertical portion 237V may be provided, a reliable confinement of the material 237 may nevertheless be accomplished, which may be advantageous when the layer 237 is to be treated in order to adjust the respective stress characteristics, when provided in the form of a sub-atmospheric chemical vapor deposition silicon dioxide.

Figure 2D:
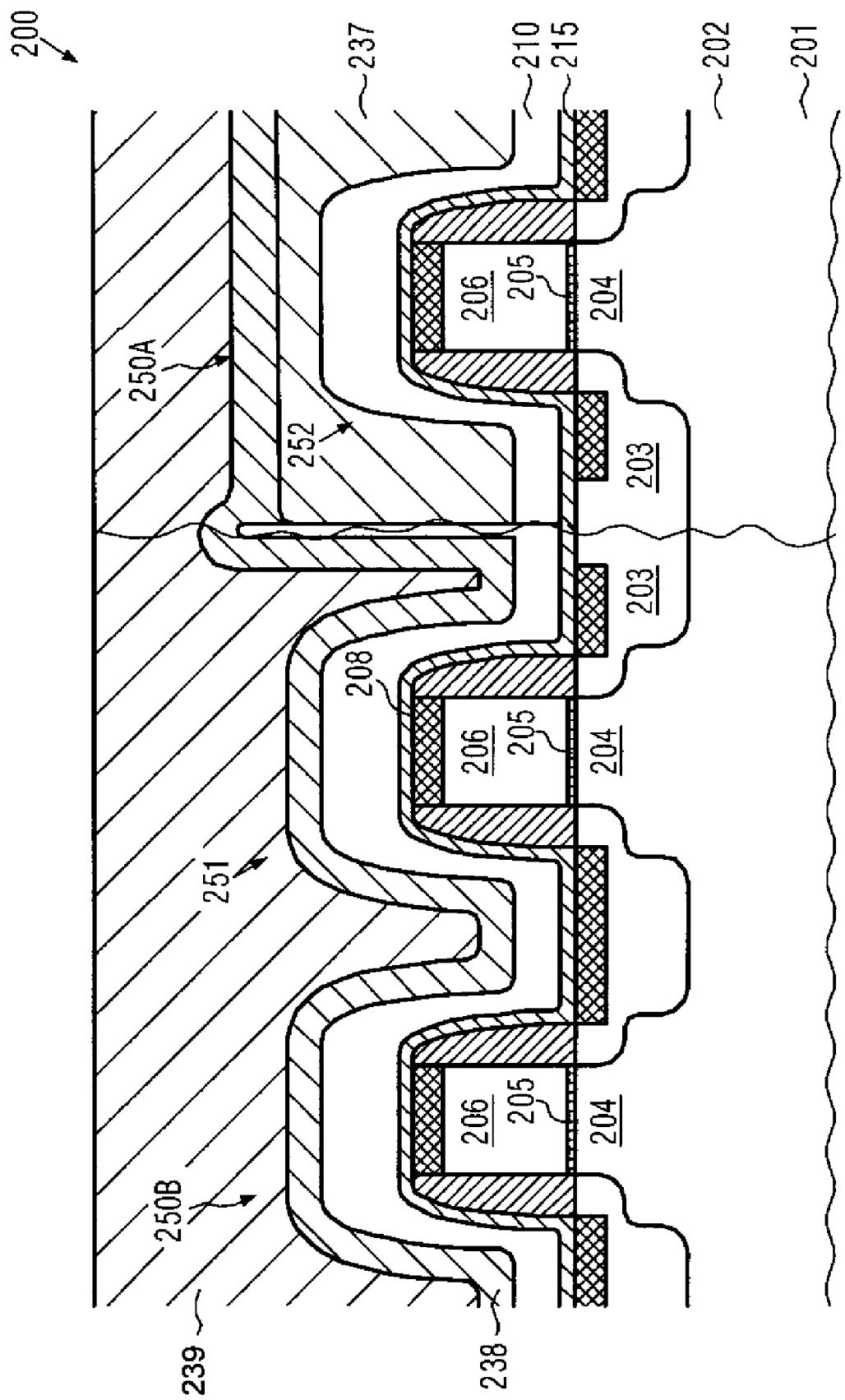

FIG. 2d schematically illustrates the semiconductor device 200 in accordance with further illustrative embodiments, wherein a further dielectric material 238 may be formed above the layer 220 and on the remaining dielectric material 237. In some illustrative embodiments, the dielectric material 237 may be provided so as to have a high compressive intrinsic stress, which may be accomplished on the basis of a corresponding treatment, if the material 237 may initially be formed on the basis of a sub-atmospheric deposition technique, or the material 237 may be provided as a highly stable PECVD silicon dioxide, which may initially be provided with high compressive stress. In this case, the further dielectric material 238 may be provided in the form of a silicon dioxide formed by sub-atmospheric chemical vapor deposition so as to exhibit a high tensile stress, which may therefore significantly enhance the resulting tensile stress for the transistors 251 in the second device region 250B. On the other hand, the material 237 may significantly reduce any effect of the tensile stress of the material 238 in the first device region 250A so that in both device regions 250A, 250B a significant performance gain may be obtained.

Finally, the desired thickness of the interlayer dielectric material embedding the transistors 251 and 252 may be completed by a further interlayer dielectric material 239, which may be provided in the form of a PECVD silicon dioxide formed on the basis of standard deposition techniques. Thereafter, the further processing may be continued by forming respective contact openings as is previously described. Consequently, by providing a planarization layer formed from an interlayer dielectric material, the overall efficiency of the resulting strain-inducing mechanism may be significantly enhanced due to the reduction of layer residuals, which may be caused by resist non-uniformities as previously explained, while, additionally, the stress characteristics of the interlayer dielectric materials may be adjusted in accordance with device requirements, that is, a compressively stressed interlayer dielectric material, such as silicon dioxide, may be provided in combination with a respective compressive contact etch stop layer, while, in other device regions, a respective tensile contact etch stop layer may be provided in combination with a tensile silicon dioxide. In other illustrative embodiments, additionally or alternatively to providing interlayer dielectric materials of different intrinsic stress, the respective stress contact etch stop layers may be provided with a high degree of non-conformality in order to enhance the stress transfer mechanism, wherein, additionally, due to the provision of a planarization layer on the basis of interlayer dielectric material, a corresponding etch indicator layer for at least one of the etch processes for selectively removing an unwanted portion of the respective contact etch stop layer may be omitted.

As a result, the subject matter disclosed herein provides a technique for significantly improving the strain-inducing mechanism by reducing the negative impact of a patterning process for selectively removing portions of stressed contact etch stop layers by establishing an increased planarity prior to the actual lithography process for providing the respective etch mask.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
forming a first stress-inducing layer above a first device region and a second device region, said first stress-inducing layer having an intrinsic stress of approximately 1.5 Giga Pascal or higher;
forming a first planarization layer above said first and second device regions to planarize a surface topography of said first and second device regions;
forming a first resist mask above said first planarization layer to cover said first device region; and
removing an exposed portion of said first planarization layer and said first stress-inducing layer from said second device region.

2. The method of claim 1, wherein forming said first planarization layer comprises forming a layer of polymer material in a highly deformable state so as to establish topography changes in said first and second device regions.

3. The method of claim 1, wherein said first planarization layer is formed to have anti-reflective characteristics with respect to an exposure radiation used to form said first resist mask.

4. The method of claim 1, wherein said first stress-inducing layer is formed by a non-conformal deposition technique.

5. The method of claim 1, wherein forming said planarization layer comprises depositing said planarization layer and performing a planarization process.

6. The method of claim 1, further comprising removing said first planarization layer and said first resist mask from said first device region and forming an etch control layer followed by forming a second stress-inducing layer above said first and second device regions.

7. The method of claim 6 wherein said second stress-inducing layer is formed by a non-conformal deposition technique.

8. The method of claim 6, further comprising forming a second planarization layer and forming a second resist mask above said second planarization layer.

9. The method of claim 8, further comprising removing a portion of said second stress-inducing layer located above said first device region on the basis of said second resist mask.

10. A method, comprising:
   forming a planarization layer above first and second transistors having formed thereabove a first stress-inducing layer having a first type of intrinsic stress;
   forming a resist mask on said planarization layer, said resist mask covering said first transistors;
   removing said first stress-inducing layer from above said second transistors;
   forming a first contact etch stop layer above said first and second transistors; and
   forming a second stress-inducing layer above said first and second transistors, said second stress-inducing layer having a second type of intrinsic stress that differs from said first type of intrinsic stress.

11. The method of claim 10, wherein said planarization layer comprises silicon dioxide.

12. The method of claim 10, further comprising forming an etch stop layer with respect to said first stress layer prior to forming said first contact etch stop layer.

13. The method of claim 10, wherein forming said planarization layer comprises depositing a dielectric material and performing a planarization process.

14. The method of claim 10, wherein said planarization layer is comprised of an interlayer dielectric material and said second stress-inducing layer is formed on said planarization layer.

15. The method of claim 14, further comprising removing said second stress-inducing layer above said first transistors.

16. The method of claim 15, wherein said planarization layer has an intrinsic stress corresponding to said first type of stress.

17. The method of claim 16, further comprising forming a further portion of said interlayer dielectric material above said first and second transistors, said further portion of said interlayer dielectric material having said second type of intrinsic stress.

18. A method, comprising:
   forming a first stress-inducing layer having a first type of intrinsic stress above a first device region and a second device region, said first and second device regions comprising first and second transistors, respectively;
   forming a first interlayer dielectric material above said first and second device regions, said first interlayer dielectric material having said first type of intrinsic stress, and reducing height differences of a surface topography of said first and second device regions;
   selectively removing said first stress-inducing layer and said first interlayer dielectric material from said second device region;
   selectively forming a second stress-inducing layer having a second type of intrinsic stress above said second device region; and
   forming a second interlayer dielectric material above said first and second device regions, said second interlayer dielectric material having said second type of intrinsic stress.

19. The method of claim 18, further comprising planarizing said first interlayer dielectric material.

20. The method of claim 18, further comprising forming a third interlayer dielectric material above said first and second device regions.

* * * * *